United States Patent [19]
Matsuoka

[11] Patent Number: 5,998,068
[45] Date of Patent: Dec. 7, 1999

[54] RETICLE AND PATTERN FORMATION METHOD

[75] Inventor: Koji Matsuoka, Kanagawa, Japan

[73] Assignee: Matsushita Electric Industrial Co., Ltd., Osaka, Japan

[21] Appl. No.: 09/017,052

[22] Filed: Jan. 27, 1998

[30] Foreign Application Priority Data

Jan. 28, 1997 [JP] Japan ..................................... 9-013775

[51] Int. Cl.⁶ ....................................................... G03F 9/00
[52] U.S. Cl. ............................................... 430/5; 430/394
[58] Field of Search ................................. 430/5, 22, 322, 430/394

[56] References Cited

U.S. PATENT DOCUMENTS 5,578,421  11/1996  Hasegawa et al. ..................... 430/313
5,766,829   6/1998  Cathey, Jr. et al. .................... 430/394

*Primary Examiner*—S. Rosasco
*Attorney, Agent, or Firm*—McDermott, Will & Emery

[57] ABSTRACT

A reticle has a phase-shifting pattern region, a normal pattern (chrome pattern) region, and a shielding region. The phase-shifting pattern region has first and second apertures and mask portions located therebetween. The first apertures transmit light opposite in phase to light transmitted by the second apertures. The normal pattern region has apertures and mask portions. The semiconductor chip regions of a resist film formed on a wafer are exposed stepwise through the phase-shifting pattern region. Subsequently, the portions of the semiconductor chip regions exposed through the phase-shifting pattern region are exposed through the normal pattern region.

6 Claims, 11 Drawing Sheets

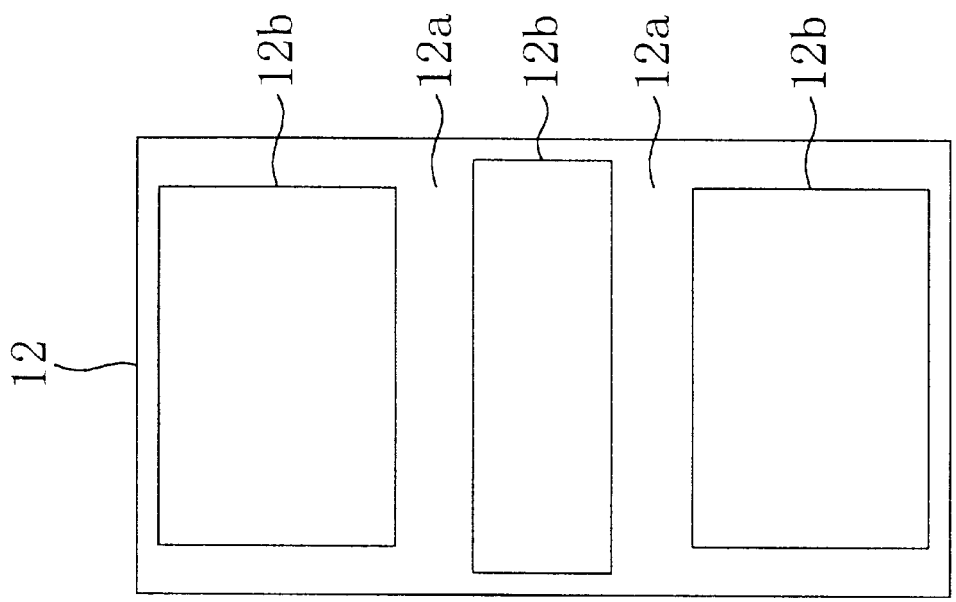
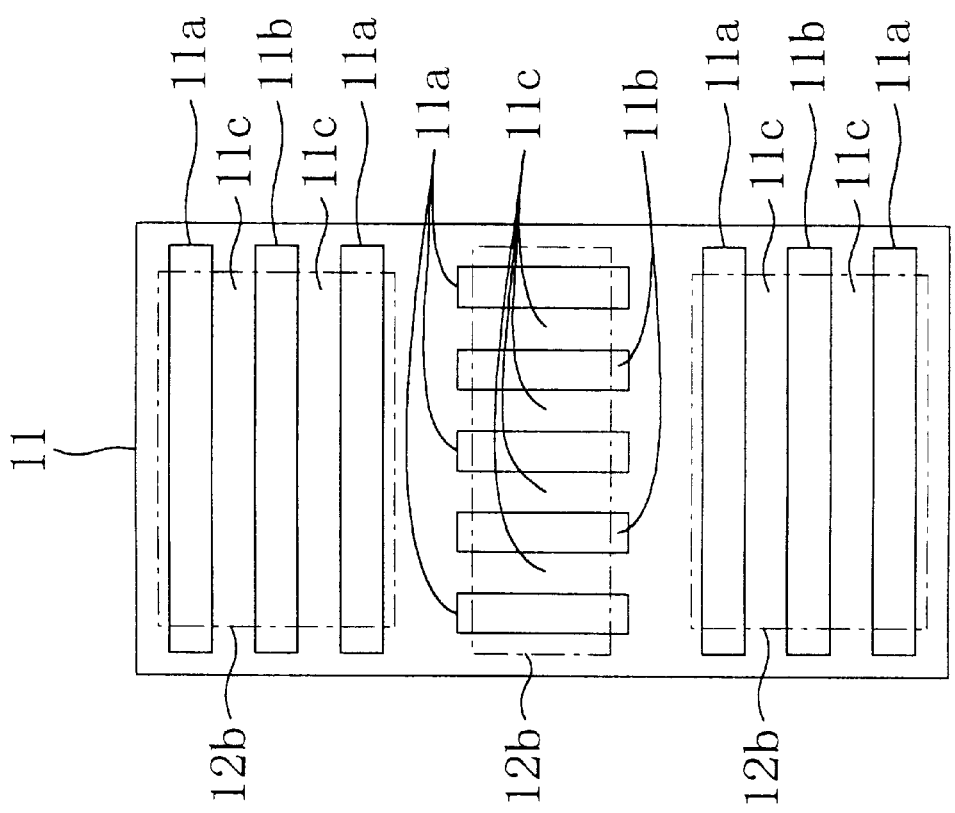

103

105

RETICLE AND PATTERN FORMATION METHOD

BACKGROUND OF THE INVENTION

The present invention relates to a reticle for forming a miniaturized pattern in a lithographic step during the process of manufacturing of a semiconductor integrated circuit and to a method of forming the pattern.

In recent years, design rules for semiconductor integrated circuits have been reduced continually to reach a point where semiconductor integrated circuits with 0.25 μm minimum features are appearing on the market. With the increasing miniaturization of pattern geometry, a G-line used conventionally as exposing light in the lithographic step has been replaced in succession by an I-line and by a KrF excimer laser or an ArF excimer laser.

While the development of an aligner using the ArF excimer laser for lithography has been delayed by the problem of laser absorption by a material composing the lens or the like, various ultra-high resolving technologies using the KrF excimer laser have been studied for practical application. Among these, the technology using an alternating phase-shifting mask promises the highest resolution. The alternating phase-shifting mask has a first aperture for transmitting regular-phase light and a second aperture for transmitting reversed-phase light, which are formed adjacent to each other with a mask portion interposed therebetween. Since the intensity of regular-phase light and the intensity of reversed-phase light cancel each other out at the mask portion, a contrast ratio is achieved between the first aperture or second aperture and the mask portion. The alternating phase-shifting mask is therefore used in combination with a negative resist to form an island pattern (isolated pattern) such as a wiring pattern.

However, the negative resist presents the intrinsic problem that a resist pattern formed thereof has inwardly tapered edge profiles (the size of a portion under measurement is different from the size of a portion directly involved in etching in the resist pattern having inwardly tapered edge profiles). When used in combination with a phase-shifting mask, the negative resist also presents the problem associated with pattern placement that the first aperture for transmitting regular-phase light and the second aperture for transmitting reversed-phase light should be formed adjacent to each other.

By contrast, a positive resist is commonly used in a lithographic step of the contemporary semiconductor process since a resist pattern formed of the positive resist has vertical or outwardly tapered edge profiles and therefore is free of the problem that the size of the portion under measurement is different from the size of the portion directly involved in etching.

Accordingly, if the alternating phase-shifting mask and the positive resist are used in combination to form a resist pattern, the problem resulting from the inwardly tapered edge profiles does not occur any more and a positive resist in common use can be used advantageously without any modification, so that excellently high resolution is achieved.

However, the combination of the alternating phase-shifting mask with the positive resist presents the problem that the light transmission portion is formed in an island pattern, which results in an indiscrete, bridged resist pattern. Hence, a miniaturized island pattern cannot be formed by using the alternating phase-shifting mask and the positive resist in combination.

Under such circumstances, Japanese Laid-Open Patent Publication HEI 8-51068 has disclosed a method of forming a miniaturized island pattern by using two reticles consisting of an alternating phase-shifting mask and a normal chrome reticle. The conventional pattern formation method disclosed in Japanese Laid-Open Patent Publication HEI 8-51068 will be described with reference to FIG. 9, FIGS. 10(a) and 10(b), and FIGS. 11(a) and 11(b).

FIG. 9 is a flow chart in accordance with the conventional pattern formation method. First, a wafer is coated with a positive resist forming a resist film.

Next, an aligner is loaded with a phase-shifting mask 101 having first and second apertures 101a and 101b and mask portions 101c as shown in FIG. 10(a), which is then subjected to a first reticle alignment. The first apertures 101a transmit light opposite in phase to light transmitted by the second apertures 101b. Namely, the light transmitted by the first apertures 101a and the light transmitted by the second apertures 101b have a 180° phase difference therebetween. Subsequently, a first wafer alignment is performed with respect to the wafer, which is then subjected to a first exposure. As a result, a miniaturized pattern in closed-loop configuration corresponding to the configuration of the mask portions 101c located between the first and second apertures 101a and 101b and having a line width less than the wavelength of exposing light is transferred onto the wafer.

Next, an aligner is loaded with a chrome reticle 102 having an aperture 102a and a mask portion 102b as shown in FIG. 10(b), which is then subjected to a second reticle alignment. Subsequently, a second wafer alignment is performed with respect to the wafer, which is then subjected to a second exposure.

The sequence of reticle alignments may be changed in order by successively performing the first alignment with respect to the chrome reticle 102 having the aperture pattern shown in FIG. 10(b) and the second alignment with respect to the phase-shifting mask 101 having the aperture pattern shown in FIG. 10(a).

As a result, regions where the mask portions 10c of the phase-shifting mask 101 and the mask portion 102b of the chrome reticle 102 overlap (hatched regions in FIG. 11(a)) constitute positive pattern regions 103, so that an island resist pattern 105 composed of the resist film as shown in FIG. 11(b) is formed on the wafer 104.

In accordance with the conventional pattern formation method, however, the total of two reticle alignments should be performed with respect to two reticles consisting of the phase-shifting mask 101 and the chrome reticle 102, while two wafer alignments should be performed accordingly with respect to the single wafer 104.

Since each of reticle loading, reticle alignment, wafer loading, and wafer alignment should be performed twice, considerable time and labor is required. In short, it is necessary to achieve throughput approximately double the throughput achieved by the normal pattern formation method.

In addition, the problem of reproducibility of pattern alignment occurs in performing the two reticle alignments and the two wafer alignments. Rotation reproducibility is particularly low in the reticle alignment so that the accuracy with which a pattern formed by the first exposure and a pattern formed by the second exposure are aligned relative to each other is reduced significantly. In the case where the pattern has an intricate configuration or undulations, allowance should be made for the reduction in alignment accuracy in setting layout rules so that the area occupied by chips formed on the wafer is increased disadvantageously.

SUMMARY OF THE INVENTION

It is therefore an object of the present invention to improve throughput and alignment accuracy in forming a resist pattern by using a positive resist and a phase-shifting mask in combination.

To attain the above object, the present invention uses a reticle having a phase-shifting pattern and a normal pattern formed in a single reticle substrate to transfer by exposure the phase-shifting pattern and the normal pattern to each of the semiconductor chip regions of a resist film.

A reticle according to the present invention is for forming an island resist pattern of a positive resist film and comprises: a first pattern region formed in a reticle substrate, the first pattern region having a first aperture for transmitting light, a second aperture for transmitting light shifted in phase by 180° from the light transmitted by the first aperture, and a mask portion formed between the first and second apertures and preventing the transmission of light to form the island pattern; and a second pattern region formed in a region of the reticle substrate other than the first pattern region, the second pattern region having an aperture for transmitting light and a mask portion preventing the transmission of light to form the island pattern.

Since the reticle according to the present invention has the first pattern region as a phase-shifting pattern region and the second pattern region as a normal pattern region each formed in the reticle substrate, the phase-shifting pattern and the normal pattern are transferred to the semiconductor chip region of the resist film by sequentially exposing the semiconductor chip region through one of the first and second pattern regions and through the other of the first and second pattern regions. What results is a miniaturized island resist pattern formed in the portion of the resist film where the mask portion of the first pattern region and the mask portion of the second pattern region are overlapping. In this case, since the single reticle is formed with the first pattern region as the phase-shifting pattern region and with the second pattern region as the normal pattern region, it is sufficient to perform each of reticle alignment and wafer alignment only once, which improves throughput and alignment accuracy.

A first pattern formation method for forming an island resist pattern of a positive resist film according to the present invention uses a reticle comprising a first pattern region formed in a reticle substrate, the first pattern region having a first aperture for transmitting light, a second aperture for transmitting light shifted in phase by 180° from the light transmitted by the first aperture, and a mask portion formed between the first and second apertures and preventing the transmission of light to form the island pattern and a second pattern region formed in a region of the reticle substrate other than the first pattern region, the second pattern region having an aperture for transmitting light and a mask portion preventing the transmission of light to form the island pattern and comprises: a first exposure step of exposing stepwise the positive resist film formed on a wafer through one of the first and second pattern regions of the reticle; and a second exposure step of exposing stepwise, through the other of the first and second pattern regions of the reticle, a portion of the resist film exposed through one of the first and second pattern regions.

In accordance with the first pattern formation method, the resist film is exposed stepwise through one of the first and second pattern regions and the portion of the resist film exposed through one of the first and second pattern regions is then exposed stepwise through the other of the first and second pattern regions, so that the phase-shifting pattern as well as the normal pattern are transferred to the resist film. What results is a miniaturized island resist pattern formed in the portion of the resist film where the mask portion of the first pattern region and the mask portion of the second pattern region are overlapping. In this case, since the single reticle is formed with the first pattern region as the phase-shifting pattern region and with the second pattern region as the normal pattern region, it is sufficient to perform each of reticle alignment and wafer alignment only once, which improves throughput and alignment accuracy.

A second pattern formation method for forming an island resist pattern of a positive resist film according to the present invention uses a reticle comprising a first pattern region formed in a reticle substrate, the first pattern region having a first aperture for transmitting light, a second aperture for transmitting light shifted in phase by 180° from the light transmitted by the first aperture, and a mask portion formed between the first and second apertures and preventing the transmission of light to form the island pattern and a second pattern region formed in a region of the reticle substrate other than the first pattern region, the second pattern region having an aperture for transmitting light and a mask portion preventing the transmission of light to form the island pattern and comprises: a first exposure step of exposing the positive resist film formed on a wafer simultaneously through the first and second pattern regions of the reticle; a second exposure step of exposing, through the second pattern region of the reticle, a portion of the resist film exposed through the first pattern region; and a third exposure step of exposing, through the first pattern region of the reticle, a portion of the resist film exposed through the second pattern region.

In accordance with the second pattern formation method, the resist film is exposed simultaneously through the first and second pattern regions and the portion of the resist film exposed through the first pattern region is subsequently exposed through the second pattern region, while the portion of the resist film exposed through the second pattern region is subsequently exposed through the first pattern region. As a result, both the phase-shifting pattern and the normal pattern are transferred to the resist film, resulting in a miniaturized island resist pattern formed in the portion of the resist film where the mask portion of the first pattern region and the mask portion of the second pattern region are overlapping. In this case, since the single reticle is formed with the first pattern region as the phase-shifting pattern region and with the second pattern region as the normal pattern region, it is sufficient to perform each of reticle alignment and wafer alignment only once, which improves throughput and alignment accuracy.

In particular, the first or second pattern formation method according to the present invention requires reticle alignment and wafer alignment to be performed only once, the accuracy with which the phase-shifting pattern and the normal pattern are aligned is determined by the accuracy with which the stage of the aligner is moved (approximately 30 nm or less). In the case where the phase-shifting mask and the normal reticle are aligned individually as in the conventional pattern formation method, an error occurs between the alignment of the phase-shifting mask and the alignment of the normal reticle. In accordance with the first or second pattern formation method according to the present invention, however, such an error does not occur so that alignment accuracy is increased significantly. Consequently, it is no more necessary to make allowance for the reduction in alignment accuracy in setting layout rules, resulting in a reduced area occupied by chips formed on the wafer.

BRIEF DESCRIPTION OF THE DRAWINGS

FIG. 3(a) is a plan view showing a phase-shifting pattern in the reticle and FIG. 3(b) is a plan view showing a normal pattern in the reticle;

DETAILED DESCRIPTION OF THE INVENTION

Figure 1:
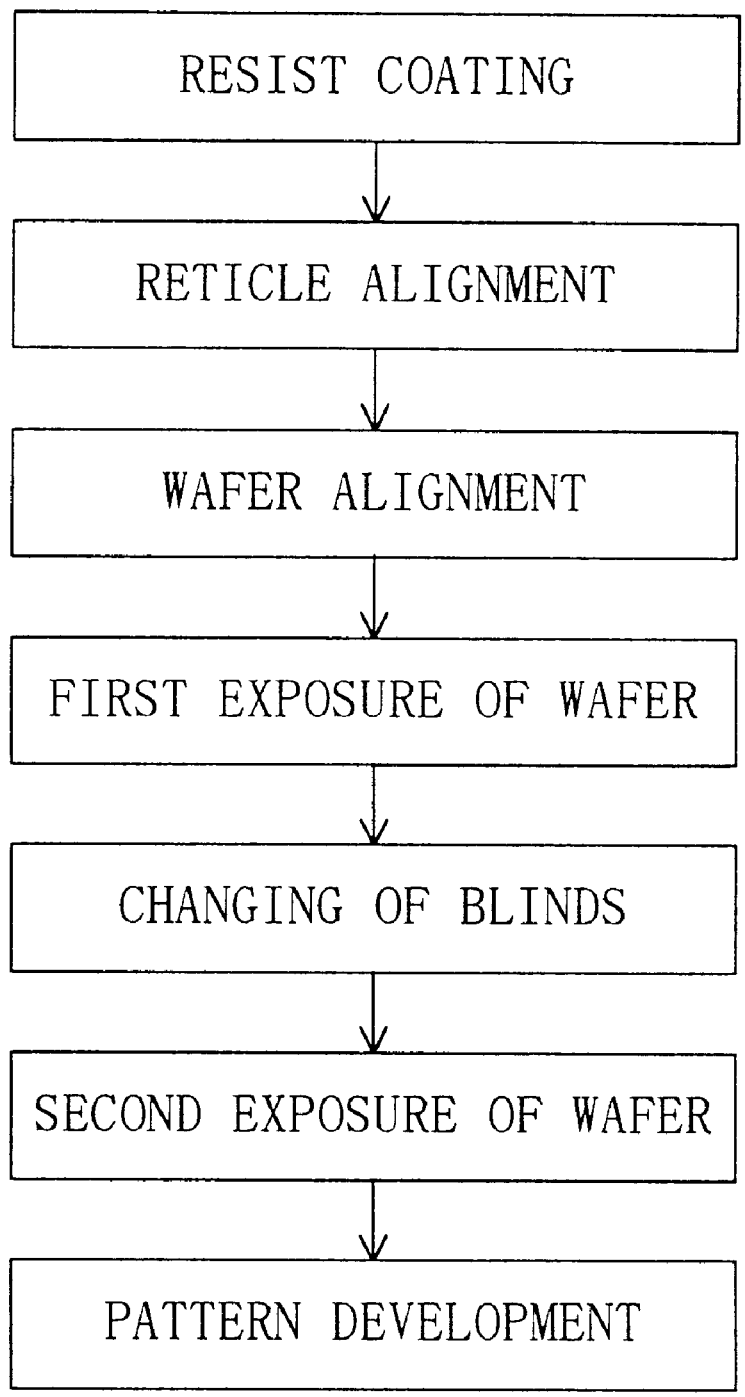
FIG. 1 is a flow chart for illustrating a pattern formation method according to a first embodiment.

Referring now to the drawings, reticles and pattern formation methods according to the individual embodiments of the present invention will be described.

First Embodiment

Figure 2:
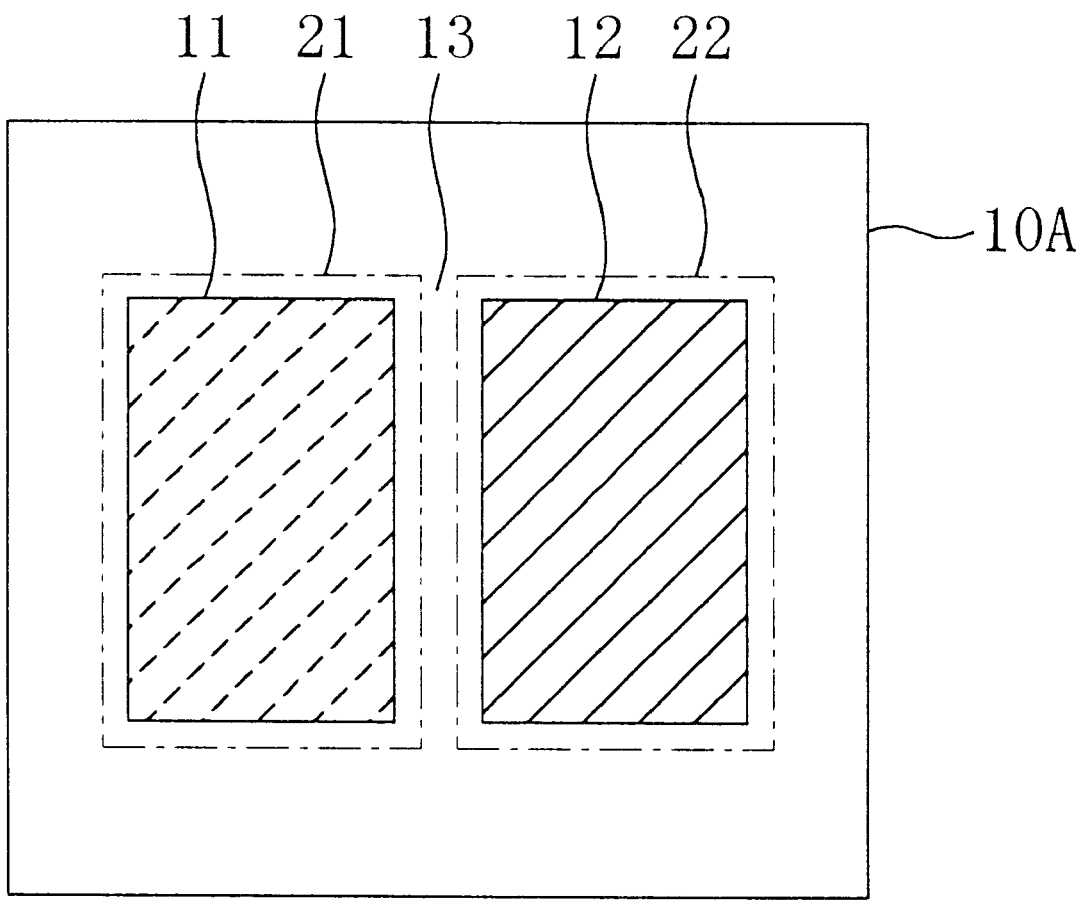
FIG. 2 is a schematic plan view of a reticle according to the first embodiment.
Figure 4:
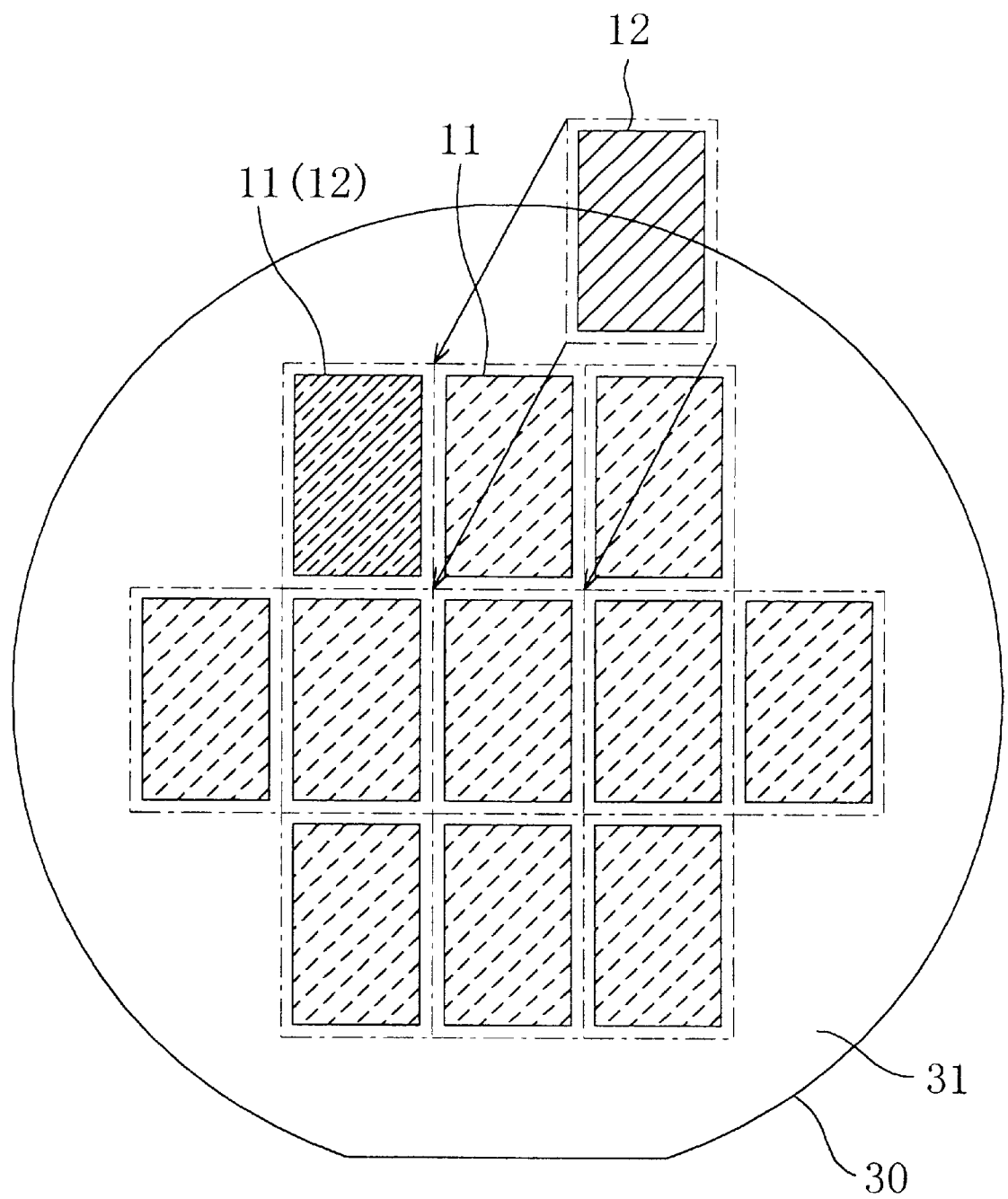
FIG. 4 is a conceptual view for illustrating the pattern formation method according to the first embodiment.

FIG. 1 is a flow chart for illustrating a pattern formation method according to a first embodiment. FIG. 2 is a plan view of a reticle according to the first embodiment. FIGS. 3(a) and 3(b) are plan views showing patterns in the reticle according to the first embodiment. FIG. 4 is a schematic view showing an exposure step in accordance with the pattern formation method according to the first embodiment.

As shown in FIG. 2, the reticle 10A according to the first embodiment has a phase-shifting pattern region 11, a normal pattern (chromium pattern) region 12, and a shielding region 13. As shown in FIG. 3(a), the phase-shifting pattern region 11 has first and second apertures 11a and 11b formed adjacent to each other with mask portions 11c located therebetween. The first apertures 11a transmit light opposite in phase to light transmitted by the second apertures 11b. Namely, the light transmitted by the first apertures 101a and the light transmitted by the second apertures 101b have a 180° phase difference therebetween. As shown in FIG. 3(b), the normal pattern region 12 has apertures 12a for transmitting light and mask portions 12b for preventing the transmission of light. In addition to the mask portions 11c of the phase-shifting pattern region 11, FIG. 3(a) also shows the mask portions 12b of the normal pattern region 12 indicated by the square bordered by the dash-dot lines in an overlapping manner, thereby showing the positional relation therebetween. FIG. 2 also shows a first blind aperture 21 and a second blind aperture 22 in an aligner.

First, as shown in FIG. 4, the entire surface of a wafer 30 is coated with a resist material forming a resist film 31.

Next, the aligner is loaded with the reticle 10A, which is then subjected to a reticle alignment. Thereafter, the first blind aperture 21 of the blind is aligned with respect to the phase-shifting pattern region 11 (the region other than the first blind aperture 21 is entirely shielded) in the aligner. A stage with the wafer 30 placed thereon is moved stepwise so that each of the semiconductor chip regions of the resist film 31 is exposed through the phase-shifting pattern region 11.

Next, the second blind aperture 22 of the blind is aligned with respect to the normal shift pattern region 12 (the region other than the second blind aperture 22 is entirely shielded) in the aligner. After the proper position of the stage is calculated at which the normal pattern region overlaps the phase-shifting pattern region, the stage with the wafer 30 placed thereon is moved stepwise so that each of the semiconductor chip regions of the resist 31 is exposed through the normal pattern region 12.

Thus, the phase-shifting pattern of the phase-shifting pattern region 11 and the normal pattern of the normal pattern region 12 are transferred in overlapping relation to each of the semiconductor chip regions of the resist film 31, which are shown by way of example in the upper left semiconductor chip region of the resist film 3. Accordingly, the portions of the semiconductor chip region where the mask portions 11c of the phase-shift pattern region 11 overlap the mask portions 12b of the normal pattern region 12 constitute a mask region (unexposed region).

In this case, since the shielding region 13 is provided between the phase-shifting pattern region 11 and the normal pattern region 12, each of the first and second blind apertures 21 and 22 has one edge positioned in the shielding region 13, so that variations in accuracy with which the blind apertures of the blind are aligned in the aligner present no problem.

The resist film 31 through the exposure steps is prebaked and developed to provide a miniaturized island pattern formed in the mask region where the mask portions 11c of the phase-shifting pattern region 11 overlap the mask portions 12b of the normal pattern region 12 in the semiconductor chip region.

According to the first embodiment, since the phase-shifting pattern region 11 and the normal pattern region 12 are formed in the single reticle 10A, it is sufficient to perform each of reticle loading and reticle alignment only once, so that the phase-shifting pattern region 11 and the normal pattern region 12 are aligned with improved accuracy, while the throughput of the exposure step is 1.7 times the throughput of the exposure step in accordance with the conventional pattern formation method.

Although the exposure step with the phase-shifting pattern region 11 has been performed prior to the exposure step with the normal pattern region 12 in the pattern formation method according to the first embodiment, the exposure step with the normal pattern region 12 may be performed prior to the exposure step with the phase-shifting pattern region 11.

Figure 5:
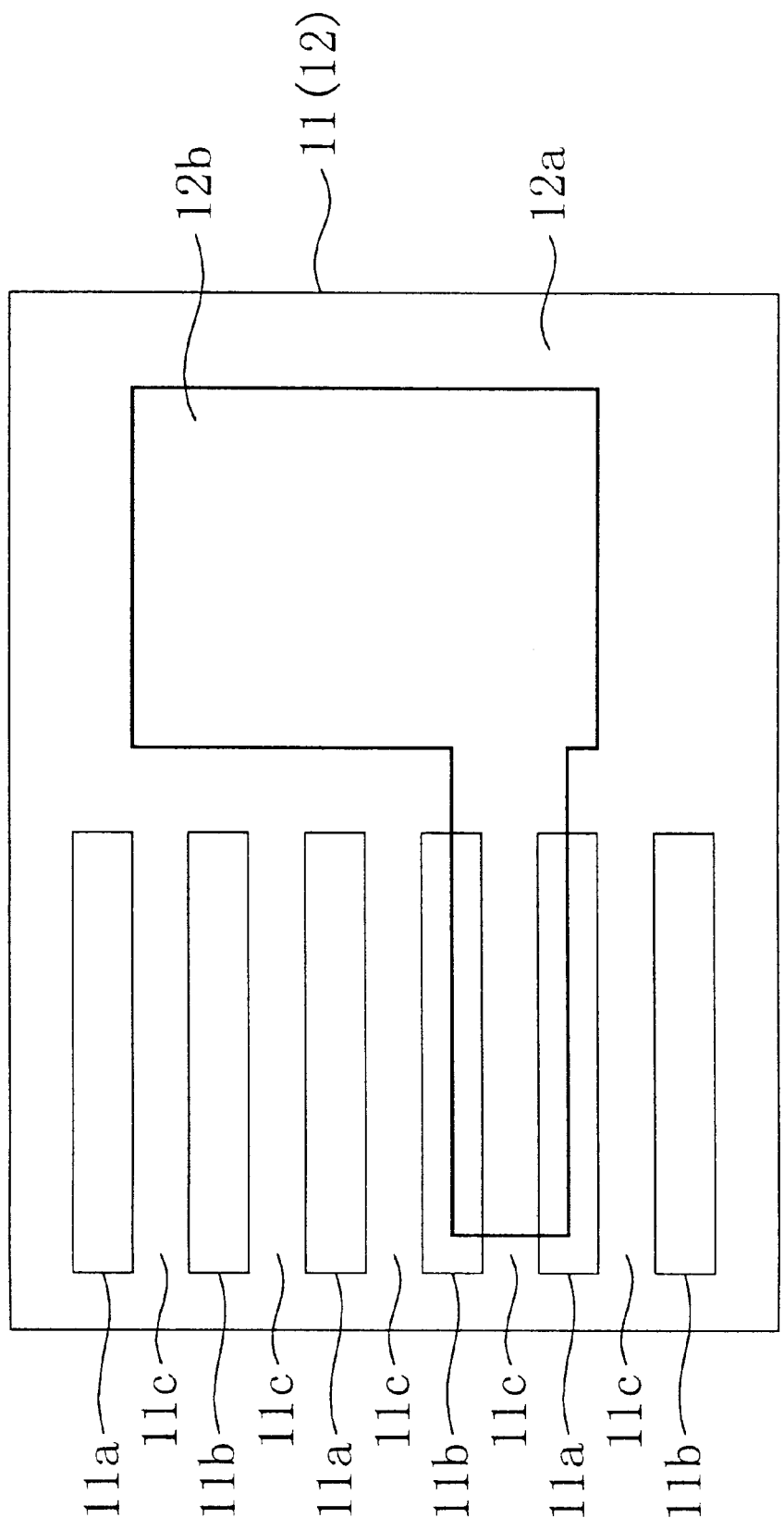
FIG. 5 is a plan view showing both a phase-shifting pattern and a normal pattern in a reticle according to a variation of the first embodiment.

FIG. 5 shows a variation of the reticle according to the first embodiment. As shown in the drawing, the phase-shifting pattern region 11 has first and second apertures 11a and 11b formed adjacent to each other with mask portions 11c located therebetween. The first apertures 11a transmit light opposite in phase to light transmitted by the second apertures 11b. The normal pattern region 12 has an aperture 12a and a mask portion 12b.

The use of the reticle 10B shown in FIG. 5 enables the formation of a miniaturized island pattern, such as a pattern for gate electrodes, in regions where the mask portions 11a of the phase-shifting pattern region 11 overlap the mask portion 12b of the normal pattern region 12.

Second Embodiment

Figure 6:
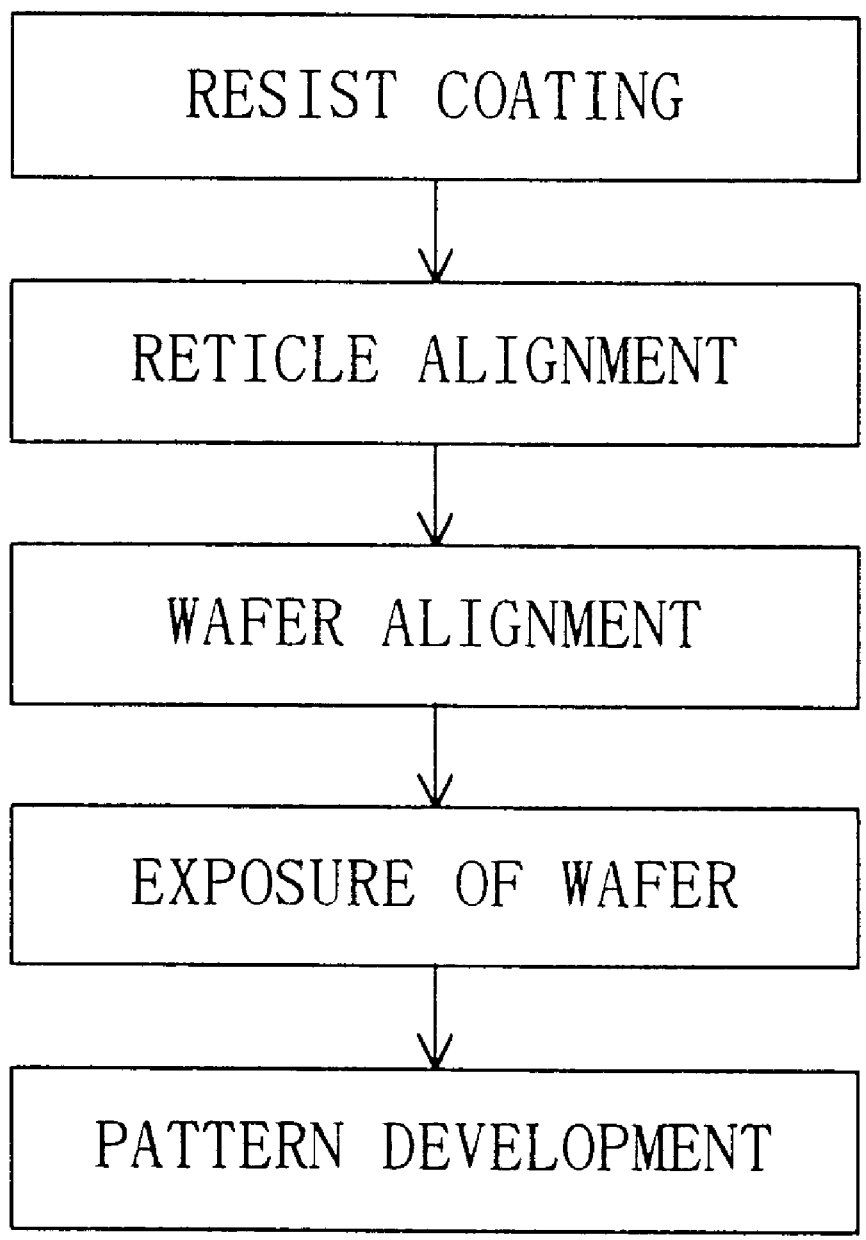
FIG. 6 is a flow chart for illustrating a pattern formation method according to a second embodiment of the present invention.
Figure 7:
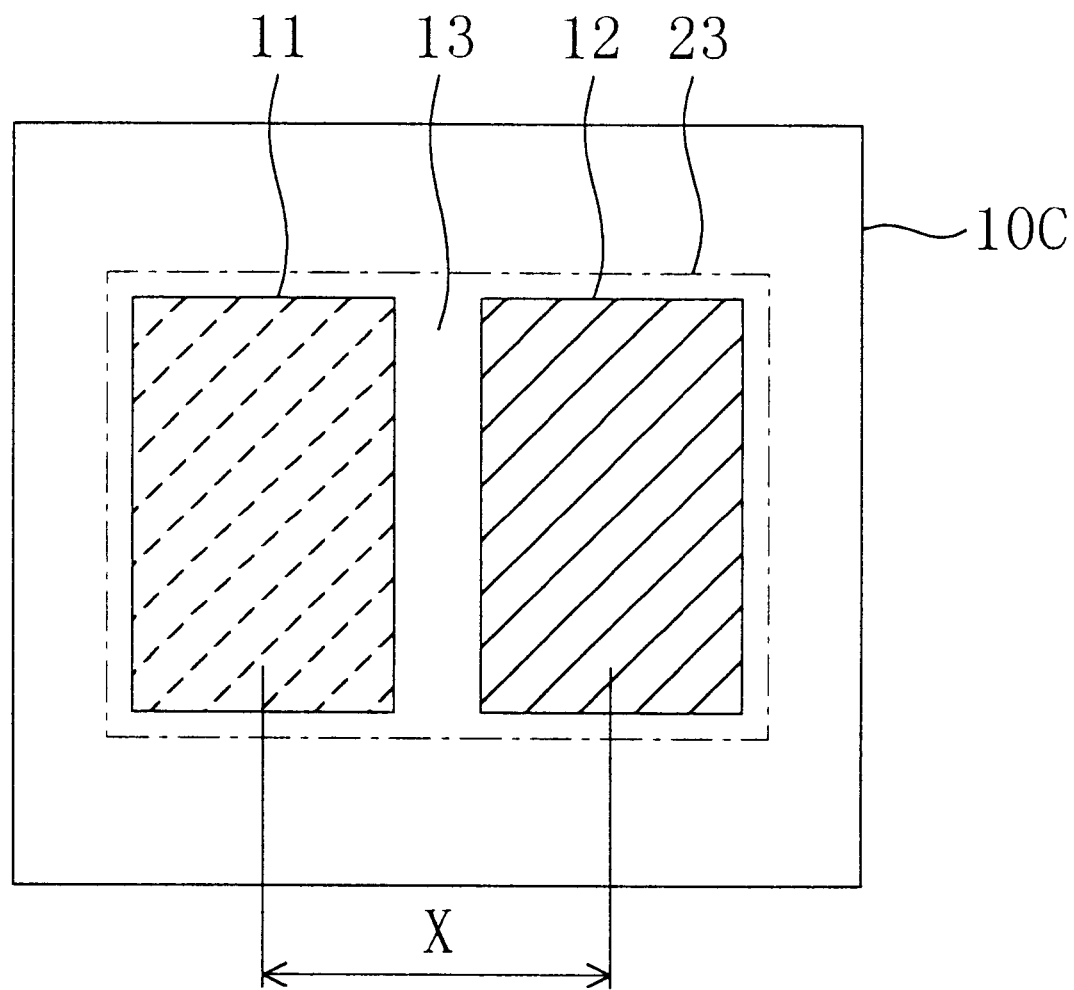
FIG. 7 is a schematic plan view of a reticle according to the second embodiment.
Figure 8:
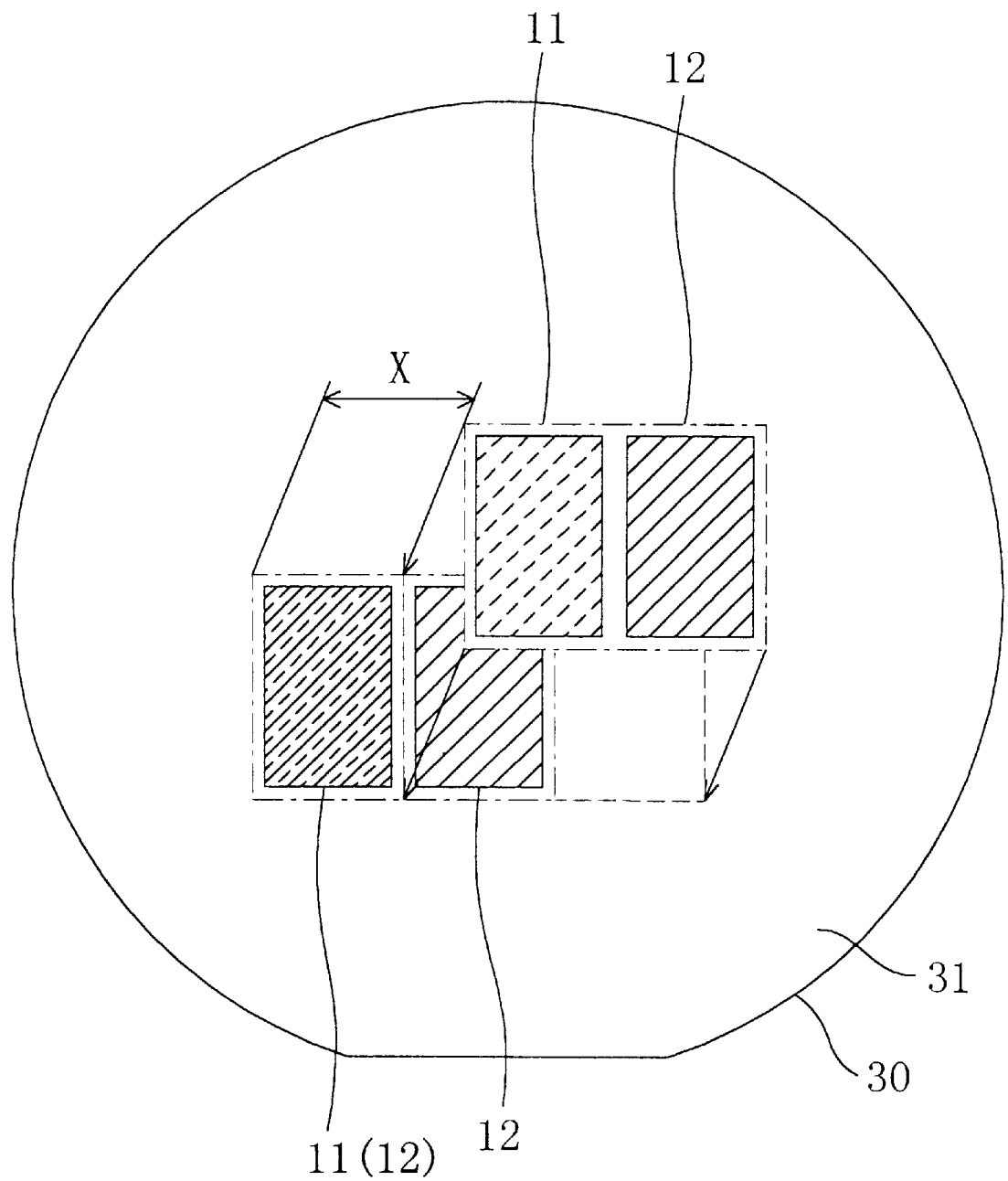
FIG. 8 is a conceptual view for illustrating the pattern formation method according to the second embodiment.
Figure 9:
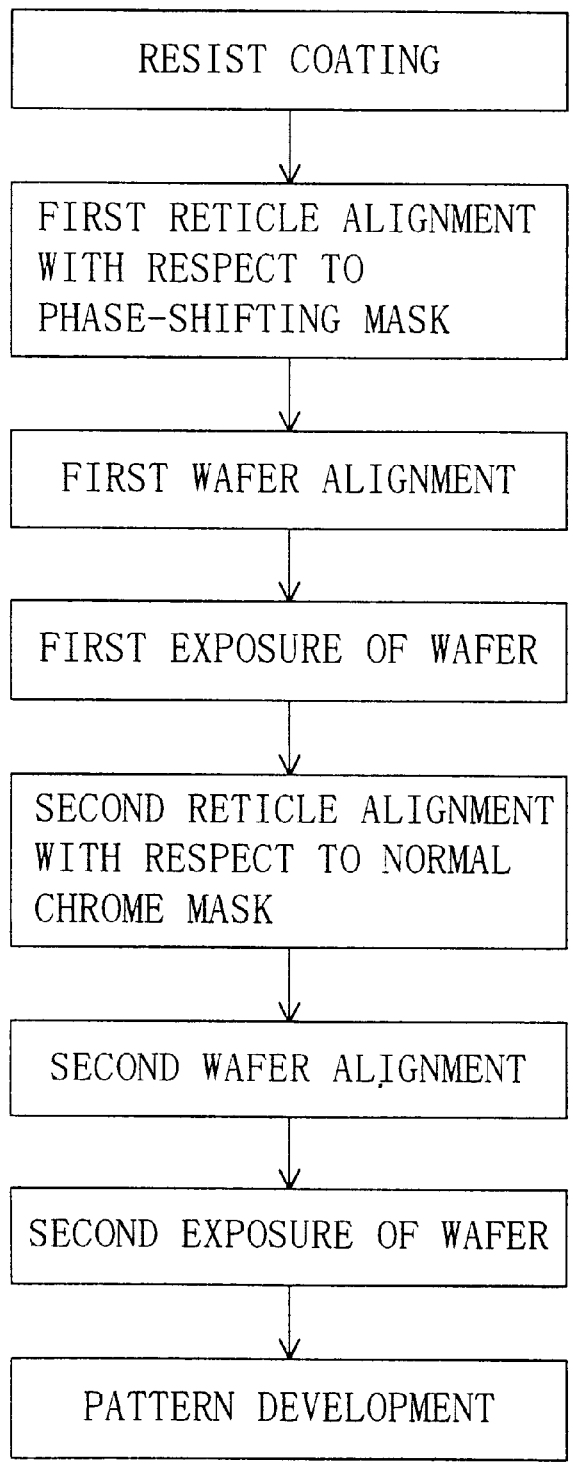
FIG. 9 is a flow chart for illustrating a conventional pattern formation method.
Figure 10A:
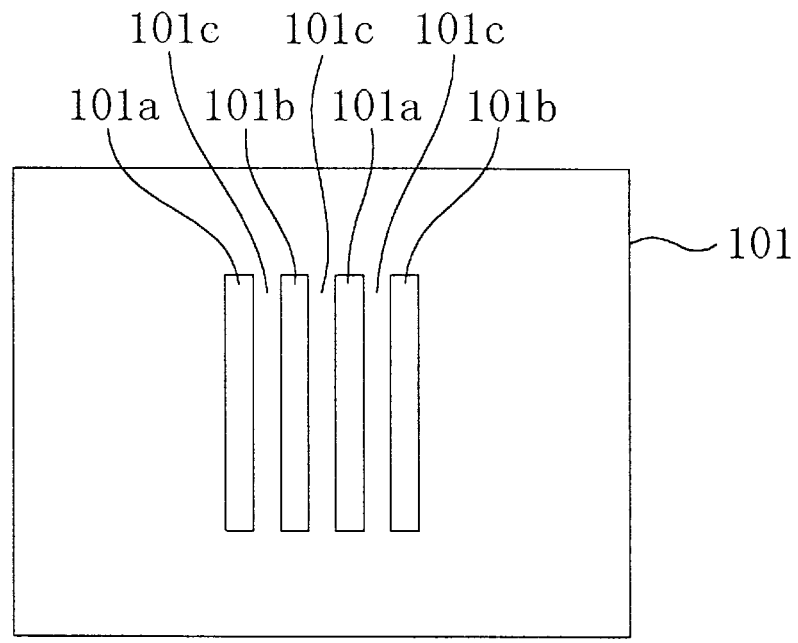
FIGS. 10(a) and 10(b) are plan views for illustrating a conventional reticle.
Figure 10B:
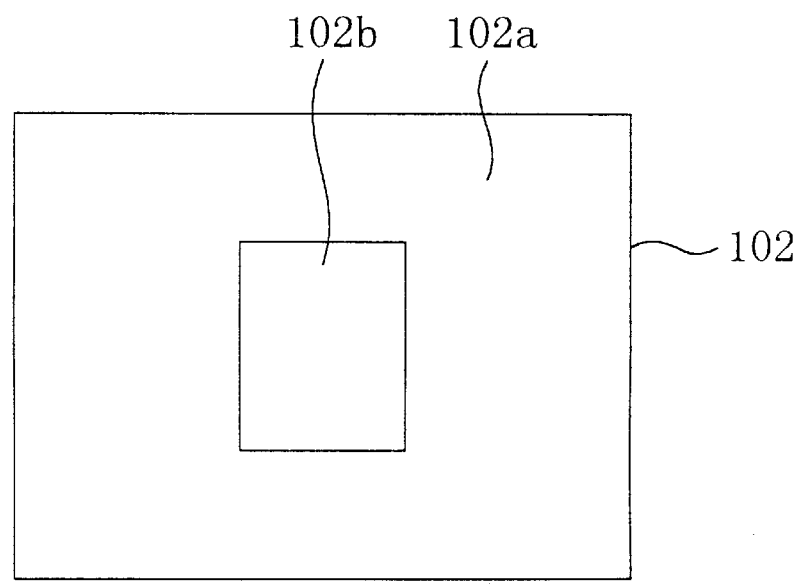
Figure 11A:
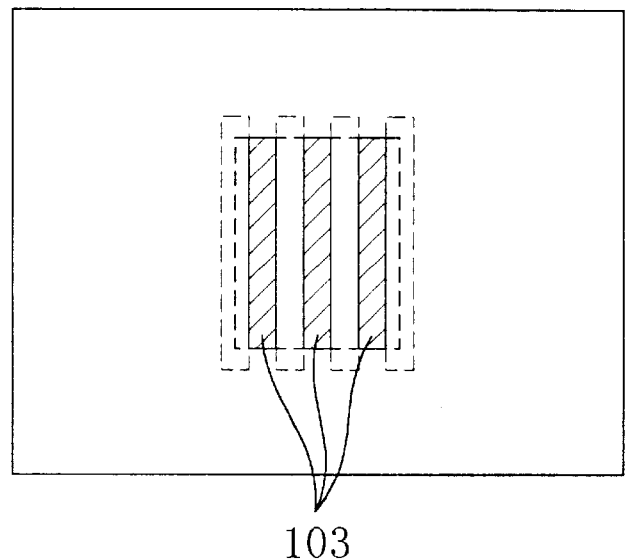
FIGS. 11(a) and 11(b) are conceptual views for illustrating the conventional pattern formation method using the conventional reticle.
Figure 11B:
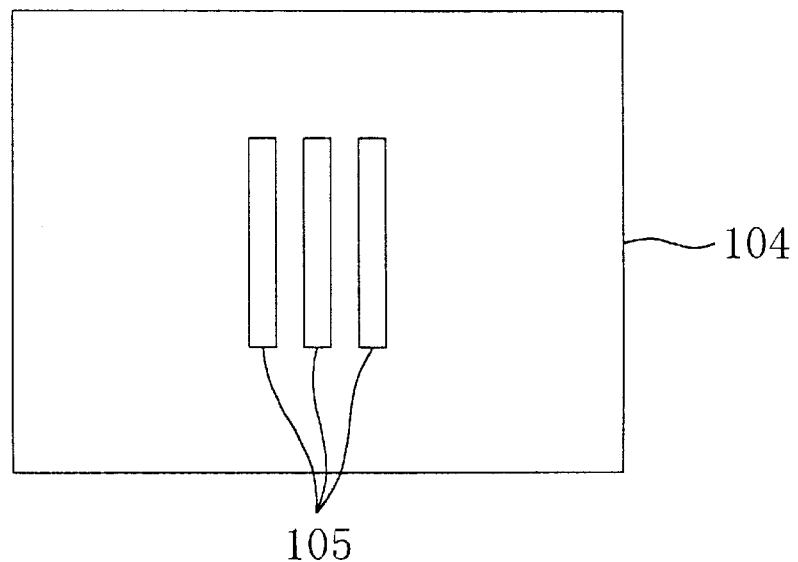

FIG. 6 shows a flow chart for illustrating a pattern formation method according to a second embodiment. FIG. 7 is a plan view of a reticle according to the second embodiment. FIG. 8 is a schematic view showing an exposure step in accordance with the pattern formation method using the reticle according to the second embodiment.

As shown in FIG. 7, the reticle 10C according to the second embodiment has a phase-shifting pattern region 11, a normal pattern (chrome pattern) region 12, and a shielding region 13. In this case, the phase-shifting pattern region 11 and the normal pattern region 12 are assumed to have an X pitch (corresponding to a pitch between semiconductor chip regions) therebetween. As shown in FIG. 3(a), the phase-shifting pattern region 11 has first and second apertures 11a and 11b formed adjacent to each other with mask portions 11c located therebetween. The first apertures 11a transmit light opposite in phase to light transmitted by the second apertures 11b. As shown in FIG. 3(b), the normal pattern region 12 has apertures 12a and mask portions 12b.

First, as shown in FIG. 7, the entire surface of a wafer 30 is coated with a resist material forming a resist mask 31.

Next, an aligner is loaded with the reticle 10C, which is then subject to areticle alignment. Thereafter, a blind aperture 23 of the blind is aligned with respect to the phase-shifting pattern region 11 as well as the normal pattern region 12(the region other than the blind aperture 23 is shielded). By moving stepwise a stage with the wafer 30 placed thereon by the X pitch (or by an X/M pitch when demagnified projection printing is performed (M is a demagnification)), each of the semiconductor chip regions of a resist film 31 is exposed simultaneously through the phase-shifting pattern region 11 and through the normal pattern region 12.

Since the semiconductor chip region exposed through the phase-shifting pattern region 11 in the preceding shot is then exposed through the normal pattern region 12 in the subsequent shot, the phase-shifting pattern of the phase-shifting pattern region 11 and the normal pattern of the normal pattern region 12 are transferred in overlapping relation to each of the semiconductor chip regions of the resist film 31, similarly to the first embodiment. Accordingly, the portions of the semiconductor chip region where the mask portions 11c of the phase-shifting pattern region 11 overlap the mask portions 12b of the normal pattern region 12 constitute a mask region (unexposed region), while the shielding regions 13 of the reticle constitute a scribe line region.

The resist film 31 through the exposure step is prebaked and developed to provide a miniaturized island pattern formed in the mask region where the mask portions 11c of the phase-shifting pattern region 11 overlap the mask portions 12b of the normal pattern region 12.

According to the second embodiment, since the phase-shifting pattern region 11 and the normal pattern region 12 are formed in the single reticle 10C, it is sufficient to perform reticle loading and reticle alignment only once, similarly to the first embodiment. Consequently, the phase-shifting pattern region 11 and the normal pattern region 12 are aligned with improved accuracy, while the throughput of the exposure step is double the throughput of the exposure step in accordance with the conventional pattern formation method.

Although the exposure step has been performed by moving stepwise the stage with the wafer 30 placed thereon by the X pitch in the pattern formation method according to the second embodiment, it is also possible to perform a first exposure step in which the semiconductor chip regions are exposed simultaneously through the phase-shifting pattern region 11 and through the normal pattern region 12, while the stage is moved stepwise by a 2X pitch, and then perform a second exposure step in which the semiconductor chip regions are exposed simultaneously through the phase-shifting pattern region 11 and through the normal pattern region 12, while the stage is moved stepwise by the 2X pitch from the starting position displaced from the initial semiconductor chip region by the X pitch. In other words, the semiconductor chip regions need not necessarily be exposed through the normal pattern region 12 immediately after exposed through the phase-shifting pattern region 11.

Although the phase-shifting pattern region 11 and the normal pattern region 12 are positioned transversely adjacent to each other in each of the reticles 10A, 10B, and 10C according to the first and second embodiments, they may be positioned vertically adjacent to each other.

Since the present invention is for the formation of an island pattern in portions where the mask portions 11c of the phase-shifting pattern region 11 overlap the mask portions 12b of the normal pattern region 12, the phase-shifting pattern region and the mask portions 12b of the normal pattern 12 for forming the island pattern may be formed in different regions.

We claim:

1. A pattern formation method by using a reticle comprising:

a first pattern region formed in a region of a reticle substrate, said first pattern region having a first aperture for transmitting light, a second aperture for transmitting light shifted in phase by 180° from the light transmitted by said first aperture, and a first mask portion formed between said first and second apertures and preventing the transmission of light; and a second pattern region formed in a different region of said reticle substrate from said region where said first pattern region is formed, said second pattern region having a third aperture for transmitting light and a second mask portion preventing the transmission of light, said pattern formation method comprising:

a first exposure step of exposing stepwise the positive resist film formed on a wafer through one of said first and second pattern regions of said reticle:

a second exposure step of exposing stepwise, through the other of said first and second pattern regions of said reticle, a portion of said resist film exposed through one of said first and second pattern regions, and a resist pattern formation step of forming an island resist pattern in a portion of said resist film where said first mask portion and said second mask portion overlap each other.

2. The pattern formation method according to claim 1, wherein each of said first and second mask portions is shaped like a belt, said belt-shaped first and second mask portions extending in the same direction.

3. The pattern formation method according to claim 1, wherein said reticle substrate includes a light shielding region between said first and second pattern regions.

4. A pattern formation method by using a reticle comprising:

a first pattern region formed in a region of a reticle substrate, said first pattern region having a first aperture for transmitting light, a second aperture for transmitting light shifted in phase by 180° from the light transmitted by said first aperture, and a first mask portion formed between said first and second apertures and preventing the transmission of light; and a second pattern region formed in a different region of said reticle substrate from said region where said first pattern region is formed, said second pattern region having a third aperture for transmitting light and a second mask portion preventing the transmission of light, said pattern formation method comprising:
- a first exposure step of exposing the positive resist film formed on a wafer simultaneously through said first and second pattern regions of said reticle;
- a second exposure step of exposing, through said second pattern region of said reticle, a portion of said resist film exposed through said first pattern region in said first exposure step:
- a third exposure step of exposing, through said first pattern region of said reticle, a portion of said resist film exposed through said second pattern region in said first exposure step; and
- a resist pattern formation step of forming an island resist pattern in a portion of said resist film where said first mask portion and said second mask portion overlap each other.

5. The pattern formation method according to claim 4, wherein after said first exposure step is performed once, said first exposure step is performed a plurality of times simultaneously with either said second exposure step or said third exposure step.

6. The pattern formation method according to claim 4, wherein after said first exposure step is performed a plurality of times by moving a stage mounting said wafer thereon by a first predetermined distance per step, said second and third exposure steps are performed once, simultaneously with each other, by moving said stage by a second predetermined distance per step, said second predetermined distance being equal to a half of said first predetermined distance, and thereafter, said second and third exposure steps are performed a plurality of times, simultaneously with each other, by moving said stage by said first predetermined distance per step.

* * * * *